US012614593B2

(12) United States Patent
Lien et al.

(10) Patent No.: US 12,614,593 B2
(45) Date of Patent: Apr. 28, 2026

(54) MANAGING ALLOCATION OF BLOCKS IN A MEMORY SUB-SYSTEM

(71) Applicant: Micron Technology, Inc., Boise, ID (US)

(72) Inventors: Yu-Chung Lien, San Jose, CA (US); Zhenming Zhou, San Jose, CA (US); Shyam Sunder Raghunathan, Singapore (SG); Tingjun Xie, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 18/647,554

(22) Filed: Apr. 26, 2024

(65) Prior Publication Data

US 2025/0006269 A1     Jan. 2, 2025

Related U.S. Application Data

(60) Provisional application No. 63/511,351, filed on Jun. 30, 2023.

(51) Int. Cl.
*G11C 16/10* (2006.01)
*G11C 16/08* (2006.01)

(52) U.S. Cl.
CPC ............ *G11C 16/102* (2013.01); *G11C 16/08* (2013.01)

(58) Field of Classification Search
CPC .............................. G11C 16/102; G11C 16/08
USPC ..................................................... 365/189.011
See application file for complete search history.

(56) References Cited

U.S. PATENT DOCUMENTS

2015/0113203 A1*   4/2015   Dancho ................. G06F 3/0616
                                                                                       711/102
2019/0043591 A1*   2/2019   Fastow ............... G11C 11/4074

\* cited by examiner

*Primary Examiner* — Alexander Sofocleous
*Assistant Examiner* — Duy H Luong
(74) *Attorney, Agent, or Firm* — Lowentein Sandler LLP

(57) ABSTRACT

A processing device, operatively coupled with a memory device, receives a request to perform a programming operation on a first set of a block addressable by a first wordline of a first die of the memory device, wherein the first die comprises a plurality of decks of the memory device. The processing device identifies, based on a predefined usage type associated with the first die, a deck of the plurality of decks for performing the programming operation; and performing the programming operation on a second set of cells of the block addressable by the first wordline residing on the identified deck of the first die.

20 Claims, 6 Drawing Sheets

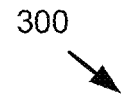

300

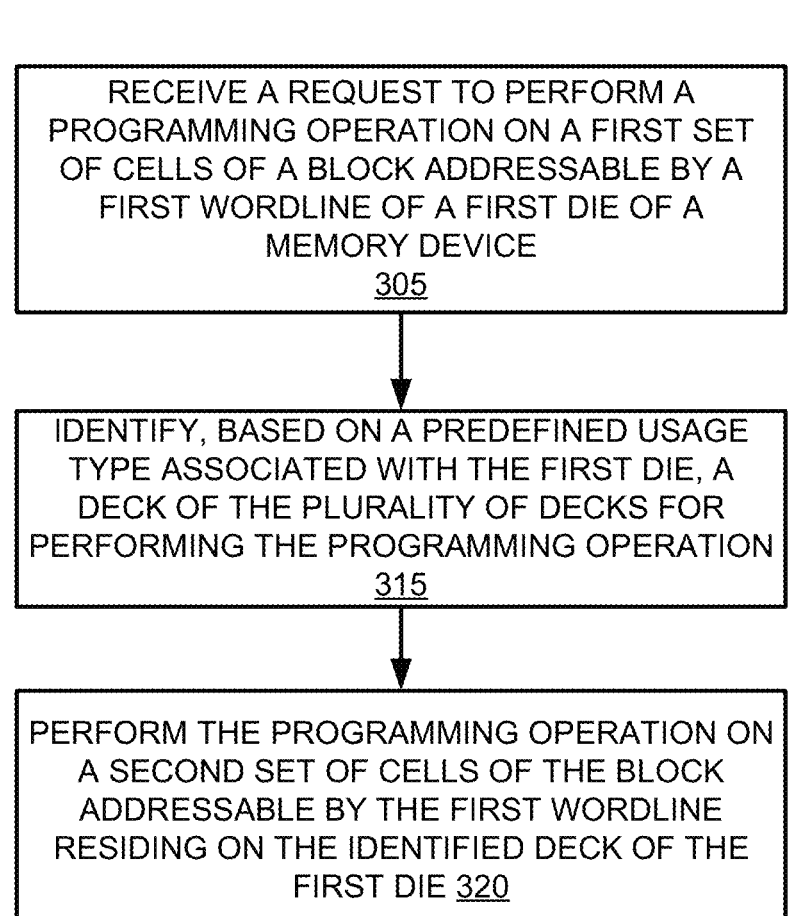

RECEIVE A REQUEST TO PERFORM A
PROGRAMMING OPERATION ON A FIRST SET
OF CELLS OF A BLOCK ADDRESSABLE BY A
FIRST WORDLINE OF A FIRST DIE OF A
MEMORY DEVICE
305

IDENTIFY, BASED ON A PREDEFINED USAGE
TYPE ASSOCIATED WITH THE FIRST DIE, A
DECK OF THE PLURALITY OF DECKS FOR
PERFORMING THE PROGRAMMING OPERATION
315

PERFORM THE PROGRAMMING OPERATION ON
A SECOND SET OF CELLS OF THE BLOCK
ADDRESSABLE BY THE FIRST WORDLINE
RESIDING ON THE IDENTIFIED DECK OF THE
FIRST DIE 320

FIG. 3

MANAGING ALLOCATION OF BLOCKS IN A MEMORY SUB-SYSTEM

RELATED APPLICATIONS

This application claims the priority and benefit of U.S. Provisional Application No. 63/511,351, filed on Jun. 30, 2023, the entire content of which is incorporated by reference herein.

TECHNICAL FIELD

Embodiments of the disclosure relate generally to memory sub-systems, and more specifically, relate to managing allocation of blocks in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a flow diagram of an example method of performing allocation of blocks in a memory sub-system, in accordance with some embodiments of the present disclosure.

DETAILED DESCRIPTION

Figure 1:
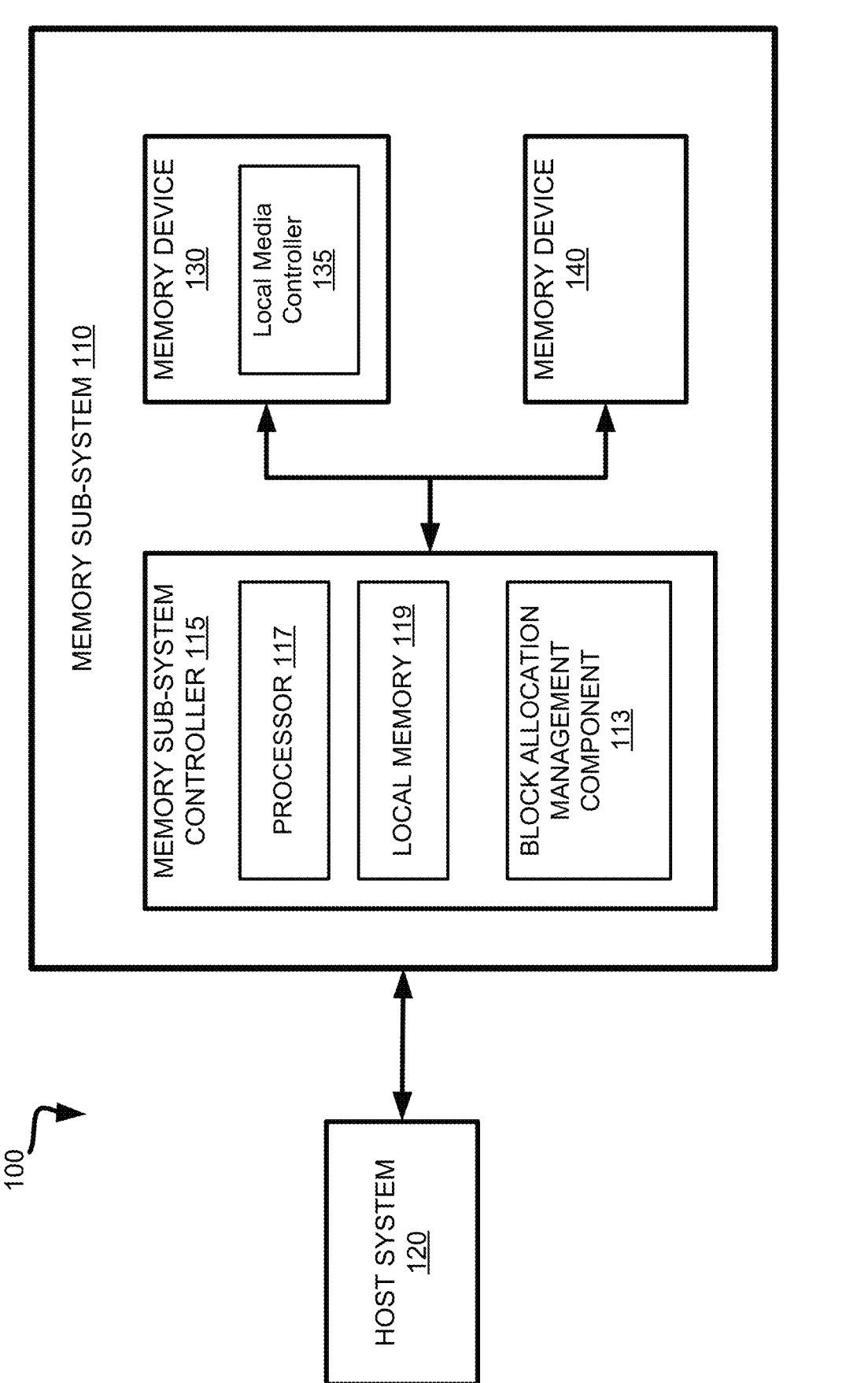
FIG. 1 illustrates an example computing system that includes a memory sub-system, in accordance with some embodiments of the present disclosure.

Aspects of the present disclosure are directed to managing allocation of blocks in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die includes one or more planes. For some types of non-volatile memory devices (e.g., NAND devices), each plane includes a set of physical blocks. Each block includes a set of pages. Each page includes a set of memory cells. A memory cell is an electronic circuit that stores information. Depending on the memory cell type, a memory cell can store one or more bits of binary information and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q, V_T) = dW/dV_T$, where dW represents the probability that any given cell has its threshold voltage within the interval $[V_T, V_T + dV_T]$ when charge Q is placed on the cell.

A memory device can exhibit threshold voltage distributions $P(Q, V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, $k=1, 2, 3 \ldots$. The distributions (valleys) are interspersed with voltage intervals ("valley margins") where none (or very few) of the cells of the device have their threshold voltages. Such valley margins can, therefore, be used to separate various charge states $Q_k$. The logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_t$ distributions. As another example, in an MLC cell, there are 3 read windows that exist with respect to the 4 $V_t$ distributions. As yet another example, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the total value of the read windows over all logical states. RWB degradation can negatively affect memory device reliability. For example, RWB degradation can lead to an increase in the number of errors (e.g., bit errors) and/or error rate (e.g., bit error rate (BER)).

Certain memory cells of certain wordlines can inherently have differing read window budgets (RWBs) and thus differing memory device reliability than other memory cells of other wordlines. The difference in RWB from wordline to wordline, and cell to cell, can be caused by variability in manufacturing processes, e.g., etching processes, etc. In certain memory devices, a cross temperature effect on memory devices can also have a significant impact on memory device reliability among wordlines. The cross-temperature effect can occur at extreme temperatures of the memory device, such as at temperatures above 60 degrees Celsius and temperatures below 10 degrees Celsius. In certain memory devices, data degradation can be measured in terms of a number of errors (e.g., bit errors) and/or error rate (e.g., using a raw bit error rate (RBER)). When performing programming operations on memory cells of word-lines with high RBERs (e.g., the RBER is greater than or equal to an RBER threshold criterion), there can be an increase in latency (and decrease in system performance) due to an additional step of performing an ECC decoding operation to correct errors in the data stored in the memory cells. In contrast, if the RBER is low (e.g., the RBER is lower than the RBER threshold criterion), no additional ECC decoding operation is performed, avoiding a decrease in system performance.

Some memory devices can include multiple decks represented by respective two-dimensional (2D) arrays of memory cells electronically addressable by a vertical access line(s) (e.g., wordline(s)). Multiple decks can be stacked within a memory device (e.g., stacked vertically). In certain memory devices, each die can be divided into multiple decks to mitigate the performance and reliability penalties. For example, a desire for increased storage capacity in memory devices drives an expansion of block sizes, including an increase in the number of wordlines in each block. The presence of such additional wordlines, however, presents certain challenges, including, for example, performance and reliability penalties attributable to various inefficiencies (e.g., associated with garbage collection or other media management operations for the increased block size). As such, a memory device can include a set of decks, such as a top (e.g., "upper") deck and a bottom (e.g., "lower") deck, each including a respective set of wordlines of the memory device. A memory device can include any number of decks. The separate decks are individually accessible, such that a memory access operation (e.g., a program, read, or erase operation) can be performed on one deck without impacting memory cells of the other deck. As such, the memory access operations can be performed at a smaller deck-level granularity, rather than a larger memory device-level granularity. For example, if a block including two decks is used in a memory device, the granularity of the block can be reduced to half, since each of the two decks can be individually accessible. This configuration can be considered a "block by deck" configuration. A block by deck block refers to a block spanning over two or more decks, such that each part of the block residing in a corresponding deck can be erased and programmed independently, thus resulting in cost reduction, per zone bandwidth gain, and write amplification reduction. In some cases, the decks in the block by deck scenario can be designated for different predefined usage types (e.g., a bottom deck usage type or an upper deck usage type). In certain memory devices, a block can be configured as a "normal" block configuration, where programming operations can be performed without using the block by deck technique (e.g., the block cannot be programmed independently on each deck).

Programming operations can be performed by the memory sub-system. The programming operations can be host-initiated operations. For example, the host system can initiate a programming operation (e.g., a write operation) on a memory sub-system. The host system can send access requests (e.g., write commands, read commands) to the memory sub-system, such as to store data on a memory device of the memory sub-system or to read data from the memory device of the memory sub-system. The data to be read or written, as specified by a host request, is hereinafter referred to as "host data." A host request can include a logical address (e.g., a logical block address (LBA) and namespace) for the host data, which is an identifier that the host system associates with the host data. The logical address information (e.g., LBA, namespace) can be part of metadata for the host data. Metadata can also include error handling data (e.g., ECC codeword, parity code), a data version (e.g., used to distinguish age of data written), a valid bitmap (specifying which LBAs contain valid data), etc. In order to isolate from the host system various aspects of physical implementations of memory devices employed by memory sub-system, the memory sub-system controller can maintain a data structure that maps each LBA to a corresponding physical address (PA). For example, for flash memory, the physical address can include the channel identifier, die identifier, page identifier, plane identifier and/or frame identifier. The mapping data structure is referred to herein as a logical-to-physical (L2P) table. The L2P table can be segmented into multiple sections. Each section can have a number of regions, and each region can include a number of mapping entries. The L2P table is maintained by the firmware of the memory sub-system controller and is stored on one or more non-volatile memory devices of the memory sub-system.

In certain memory devices, in order to simplify L2P tables and reduce system overhead when performing programming operations, a memory sub-system controller can logically group similarly located blocks across planes of multiple dice into one block (i.e., a virtual block) to perform concurrent programming operations. Similarly located blocks can be blocks at similar physical locations (e.g., along the same wordline and/or blocks with the same or similar physical addresses) in each die, as described in more detail below. The memory sub-system controller can address the virtual block using a single logical block address. For example, the memory sub-system controller can map the virtual block to a "logical block address 1" in the L2P table. The memory sub-system controller can thus use the same logical block address of the virtual block to perform concurrent programming operations on blocks at similar physical locations (e.g., along the same wordline) across each die.

However, as described above, certain wordlines have inherently higher RBERs. Therefore, since the logical block address of a virtual block can address blocks at similar physical locations (e.g., along the same wordline) across each die, there can be cases where the logical block address of a virtual block addresses blocks along wordlines that have inherently higher RBERs. There can thus be an increased risk that a programming operation can be addressed to a logical block address of a virtual block that includes blocks along wordlines with inherently higher RBERs. Performing the programming operation can lead to data degradation due to having to perform additional ECC decoding operations for each wordline of each die due to the higher RBERs. In certain cases, this can also lead to a host timeout, where the amount of time for performing a programming operation reaches the time limit the host system sets for performing the programming operation. Host timeouts can often lead to system failures due to having to continue performing programming operations on wordlines with high RBERs across each die, where performing each programming operation results in another host timeout.

Aspects of the present disclosure address the above and other deficiencies by performing allocation of blocks in a memory sub-system to avoid high RBER clusterings among wordlines in each die of a memory device. In some implementations, a memory sub-system controller receives a request to perform a programming operation (e.g., a write operation) on a set of memory cells of a block formed by a wordline residing on a certain die of a memory device. The memory sub-system controller identifies an upper deck or bottom deck of the memory device to perform the programming operation. Identifying the upper deck or bottom deck can be based on a predefined usage type associated with each die of the memory device. The predefined usage type can be a configuration setting that specifies whether the die is in a block by deck configuration or a "normal" block configuration. The block by deck configuration can further include two sets of configuration settings, such as an upper deck configuration and a bottom deck configuration. The predefined usage type can be assigned to each die by the memory sub-system controller and/or a firmware component during an offline testing phase of the memory device. The predefined usage type can be set according to identified high RBER clusterings among the wordlines of each die and/or based on an error count of each die. For example, the predefined usage type can be set to perform programming operations on the upper deck of a certain die or the bottom deck of another die to avoid performing programming operations on sets of cells addressable by wordlines in areas of each die with high RBER clusterings and/or a high error count. The memory sub-system controller can retrieve an entry referenced by the predefined usage type from a metadata structure, e.g., a look-up table and/or a logical-to-physical (L2P) table. The memory sub-system controller can then perform the programming operation on a set of cells of the block formed by the wordline on the identified deck (e.g., upper deck or bottom deck) of the memory device, as described in more detail below.

Performing allocation of blocks in a memory sub-system can result in overall improved performance of memory devices and an increase in data reliability. Instead of using the blocks formed by wordlines in the same deck on each die when performing programming operations, the memory sub-system can use blocks formed by wordlines in different decks on a die to perform each programming operation, thus ensuring that different wordlines can be used when performing programming operations and thus avoiding high RBER clusterings on each die of a memory device. Allocating blocks can avoid cases where using the same wordlines on a deck of each die results in using only wordlines with high RBERs. As described above, high RBER/degradation can be seen in similar wordlines of all dice due to the similar physical characteristics of each die. Performing programming operations on wordlines with high RBER can lead to data degradation, thus resulting in a slower system performance due to having to perform additional ECC decoding operations and/or a host timeout. Thus, allocating blocks where programming operations are performed across decks on each die can help avoid using wordlines with similar high RBERs among all dice (e.g., high RBER clusterings). Furthermore, allocating blocks can also have minimal impact on system performance because the allocation only occurs once during the lifetime of the memory device for each die. This can thus result in an increase in data reliability, an avoidance of a host system timeout, and an improvement in overall system performance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, the memory sub-system 110 includes a block allocation component 113 that can be used to perform allocation of blocks in a memory device 130 or memory device 140. The block allocation component 113 receives a request to perform a programming operation (e.g., a write operation) on a set of memory cells of a block formed by a wordline residing on a certain die of a memory device. The block allocation component 113 identifies an upper deck or bottom deck of the die of the memory device to perform the programming operation. Identifying the upper deck or bottom deck can be based on a predefined usage type associated with each die of the memory device. The predefined usage type can be a configuration setting that specifies whether the die is in a block by deck configuration or a normal block configuration. The block by deck configuration can further include two sets of configuration settings, such as an upper deck configuration and a bottom deck configuration. The predefined usage type can be assigned to each die by the memory sub-system controller and/or a firmware component during an offline testing phase of the memory device. The predefined value can be set according to identified high RBER clusterings among the wordlines of each die and/or based on an error count of each die. For example, the predefined usage type can be set to perform programming operations on the upper deck of a certain die or the bottom deck of another die to avoid performing programming operations on sets of cells addressable by wordlines in areas of each die with high RBER clusterings and/or a high error count. The memory sub-system controller can retrieve an entry referenced by the predefined usage type from a metadata structure, e.g., a look-up table and/or a logical-to-physical (L2P) table. The block allocation component 113 can then perform the programming operation on a set of cells of the block formed by the wordline on the identified deck (e.g., upper deck or bottom deck) of the memory device, as described in more detail below.

Further details with regards to the operations of the block allocation component 113 are described below.

Figure 2A:
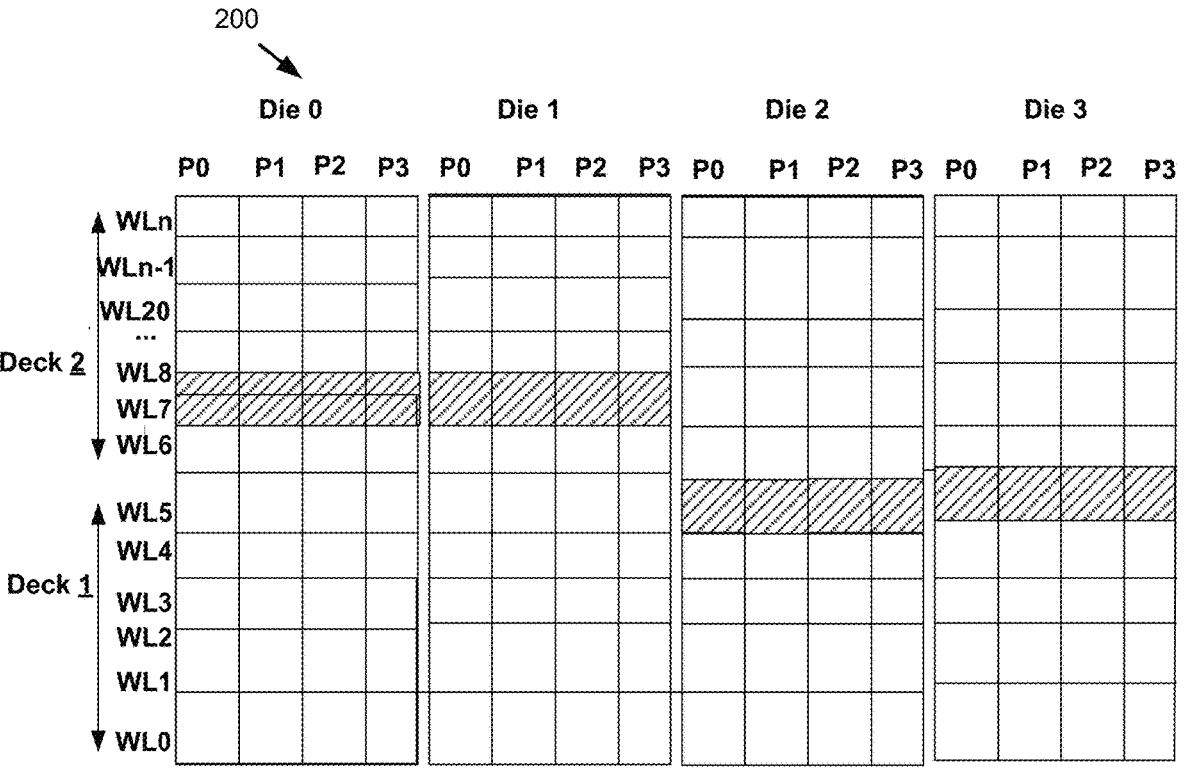
FIG. 2A is a block diagram illustrating an example set of wordlines across a set of decks and die, in accordance with some embodiments of the present disclosure.

FIG. 2A is a block diagram illustrating an example set of wordlines located across a set of decks and die, in accordance with some embodiments of the present disclosure. As illustrated in FIG. 2A, a memory device (e.g., the memory device 130 of FIG. 1) can include 4 dice, such as die 0, die 1, die 2, and die 3. Each die can have a set of 4 planes, such as plane (P) 0, P1, P2, and P3. Each die can have a set of wordlines that are formed across the planes of the die. For example, die 0 can have a set of wordlines starting with WL0 (i.e., a wordline with an index value of 0) to WLn (i.e., a wordline with an index value of n). Die 1 can have a set of wordlines starting with WL0 (i.e., a wordline with an index value of 0) to WLn (i.e., a wordline with an index value of n). Die 2 can have a set of wordlines starting with WL0 (i.e., a wordline with an index value of 0) to WLn (i.e., a wordline with an index value of n). Die 3 can have a set of wordlines starting with WL0 (i.e., a wordline with an index value of 0) to WLn (i.e., a wordline with an index value of n). Each die can include a set of decks, such as deck 1 (e.g., a bottom deck) and deck 2 (e.g., an upper deck). For example, WL0 to WL5 of each die can be part of deck 1, and WL6 to WLn can be part of deck 2. In some implementations, each die can include any number of decks (e.g., 2 decks, 3 decks, etc.).

In some implementations, a memory sub-system controller (e.g., the memory sub-system controller 115 of FIG. 1) can group similarly located blocks across planes and decks of multiple dice into one block (i.e., a virtual block) for performing programming operations at a logical address of each virtual block. Similarly located blocks can be blocks at similar physical locations (e.g., along the same wordline and/or blocks with the same or similar physical addresses) in each die. For example, the memory sub-system controller can group the blocks of the 4 planes of die 0 along WL0, the blocks of the 4 planes of die 1 along WL0, the blocks of the 4 planes of die 2 along WL0, and the blocks of the 4 planes of die 2 along WL0 into one virtual block. In the above example, the blocks of each die along the same wordline (i.e., WL0) are grouped into the virtual block in the above example. In some implementations, the memory sub-system controller can receive programming commands addressed to a logical block address of the virtual block (e.g., addressed to each block of the 4 planes of die 0, die 1, die 2, and die 3, along WL0).

The memory sub-system controller can receive one or more requests to perform programming operations on sets of memory cells formed by wordlines residing on each die. For example, as illustrated by FIG. 2A, the memory sub-system controller can perform a programming operation (indicated with the shaded lines) on die 0 on a set of memory cells. The memory sub-system controller can determine which deck of die 0 on which to perform the programming operation. For example, the memory sub-system controller can retrieve an entry referenced by a predefined usage type of die 0 (e.g., from a metadata structure, such as a look-up table and/or L2P table), where the predefined usage type can be a configuration setting that specifies whether a die is in a block by deck configuration or a normal block configuration. The block by deck configuration can further include two sets of configuration settings, such as an upper deck configuration and a bottom deck configuration. The metadata structure can include a set of entries, where each entry includes a die identifier identifying a die of a memory device and a predefined usage type assigned to the die identifier. Retrieving the entry referenced by the predefined usage type can include identifying die 0 using a die identifier (e.g., "die 0") in an entry of the metadata structure and identifying the predefined usage type assigned to the die identifier. The memory sub-system controller can set and/or assign a predefined usage type to each die of a memory device according to identified high RBER clusterings among the wordlines of each die and/or based on an error count of each die. For example, the memory sub-system controller can assign a predefined usage type to a die, where the predefined usage type specifies a block by deck configuration, which specifies that programming operations are to be performed on the upper deck of the die or the bottom deck of the die to avoid performing programming operations on sets of cells addressable by wordlines in areas of each die with high RBER clusterings and/or a high error count. In response to retrieving the entry referenced by the predefined usage type corresponding to a block by deck configuration, the memory sub-system controller can identify the deck on die 0 (e.g., the upper deck or the bottom deck) and then perform the programming operation on a set of memory cells on a block residing on that deck (e.g., the upper deck or the bottom deck) of die 0.

Figure 2B:
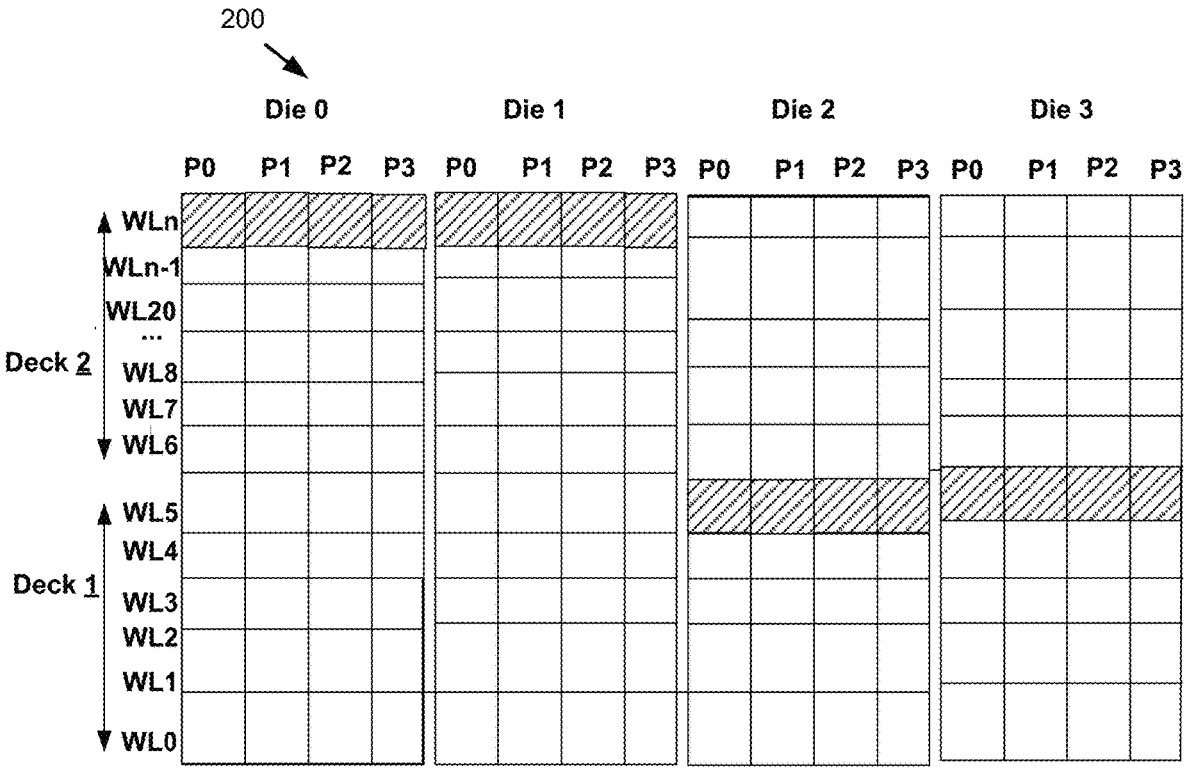
FIG. 2B is a block diagram illustrating an example set of wordlines across a set of decks and die, in accordance with some embodiments of the present disclosure.
Figure 2C:
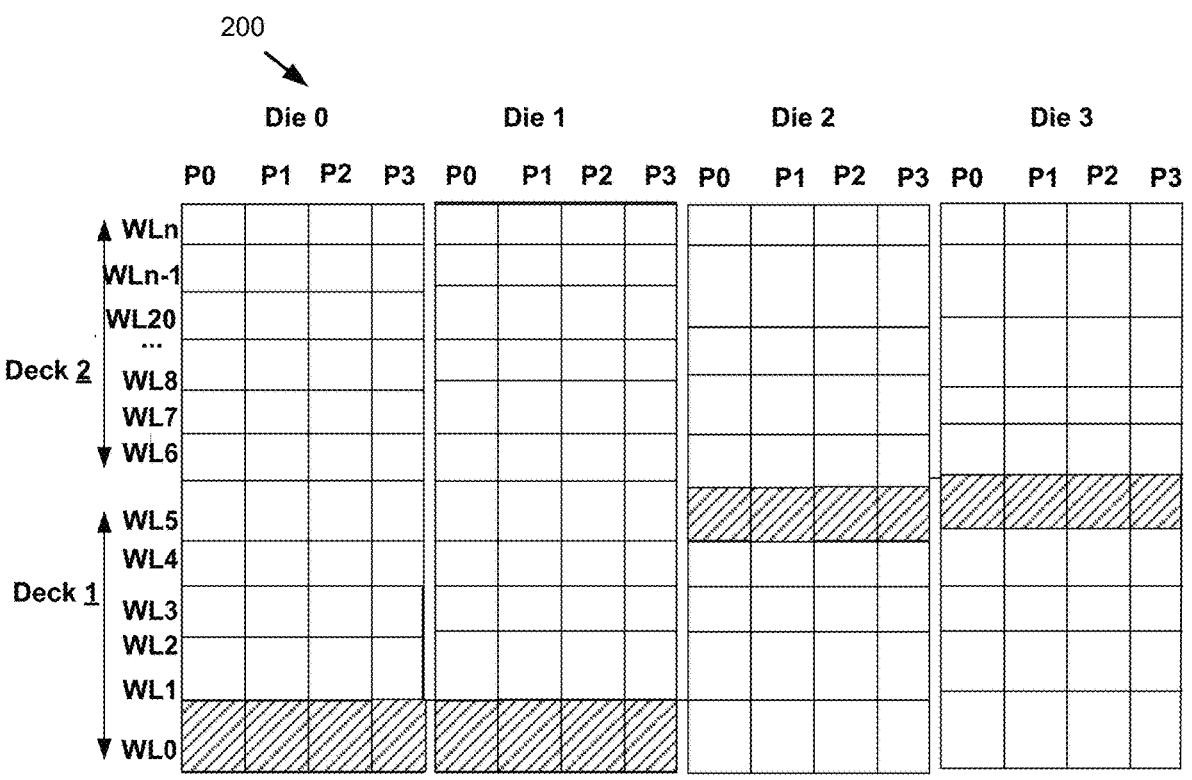
FIG. 2C is a block diagram illustrating an example set of wordlines across a set of decks and die, in accordance with some embodiments of the present disclosure.

In some implementations, as illustrated in FIG. 2B, the memory sub-system controller can retrieve an entry referenced by a predefined usage type of die 0 that corresponds to a normal block configuration. In response to retrieving the entry referenced by the predefined usage type corresponding to the normal block configuration, the memory sub-system controller can perform programming operations on "normal" blocks of die 0. A normal block refers to a block that resides on either an upper deck or a bottom deck of the memory device (e.g., a block without using the block by deck configuration in which a block spans over a set of decks). In some implementations, certain dice of a memory device can be assigned to a predefined usage type corresponding to a normal block configuration, while other dice of the memory device can be assigned to a predefined usage type corresponding to a block by deck configuration. For example, die 0 and die 1 of FIG. 2B can be assigned to a normal block configuration, such that the memory sub-system controller can perform programming operations on normal blocks of die 0 and die 1. Die 2 and die 3 of FIG. 2B can be assigned to a block by deck configuration, such that the memory sub-system controller can perform programming operations on block by deck blocks of die 2 and die 3. As described herein, a block by deck block refers to a block formed by two or more decks, where each deck is independently accessible. In some embodiments, the programming operations can be performed on the normal blocks in a particular order (e.g., in a drain to source programming sequence). In some embodiments, as illustrated in FIG. 2C, the programming operations can be performed on the normal blocks on die 0 and die 1 in another order (e.g., a source to drain programming sequence). A source to drain programming sequence refers to a sequence of programming operations in which electric current flows across a memory cell from the source electrode to the drain electrode in a memory device. A drain to source programming sequence refers to a sequence of programming operations in which electric current flows across a memory cell from the drain electrode to the source electrode in a memory device.

FIG. 3 is a flow diagram of an example method of performing allocation of blocks in a memory sub-system, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by block allocation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic receives a request to perform a programming operation on a set of cells of a block addressable by a wordline of a die (e.g., a first die) of a memory device (e.g., the memory device 130 of FIG. 1). In some implementations, the programming operation is a write operation. The processing logic can receive the request to perform the programming operation from a host system (e.g., the host system 120 of FIG. 1). In some embodiments, the request to perform the programming operation can specify a logical block address that addresses a virtual block as described herein (e.g., a group of blocks across planes of multiple dice along similarly located wordlines). In some implementations, each die of the memory device can include a set of decks. In some implementations, the block of the die can span over the set of decks of the memory device in a block by deck configuration. For example, the set of decks can include at least two independent decks. Each independent deck can be independently accessible for a memory access operation (e.g., a programming operation). In some implementations, the set of decks can include a first deck, such as an upper deck, and a second deck, such as a lower deck (e.g., bottom deck). In some implementations, the block of the die can reside on a particular deck of the set of decks (e.g., an upper deck or bottom deck) in a "normal" block configuration.

At operation 315, the processing logic identifies, based on a predefined usage type associated with the die, a deck of the set of decks for performing the programming operation. Identifying the deck for performing the programming operation (e.g., the upper deck or bottom deck) can be based on determining a predefined usage type associated with each die of the memory device. The predefined usage type can be a configuration setting that specifies whether the die is in a block by deck configuration or a "normal" block configuration. The block by deck configuration can further include two sets of configuration settings, such as an upper deck configuration and a bottom deck configuration. The predefined usage type can be assigned to each die by the memory sub-system controller and/or a firmware component during an offline testing phase of the memory device. The predefined usage type can be set according to identified high RBER clusterings among the wordlines of each die and/or based on an error count of each die. The predefined usage type can be different for each die. For example, certain die of the memory device can be set to use a bottom deck of the memory device in a block by deck configuration, another die of the memory device can be set to use an upper deck of the memory device in a block by deck configuration, another die of the memory device can be set to use any deck of the memory device in a normal block configuration. The processing logic can retrieve an entry referenced by the predefined usage type from a metadata structure, such as a table, e.g., a look-up table and/or a logical-to-physical (L2P) table. The metadata structure can include a set of entries, where each entry stores an identifier of a die of the memory device with a corresponding predefined usage type assigned to the die. The predefined usage type assigned to the die can be determined through an error count characterization measurement on a die of the set of decks and/or on a die of the memory device. The error count characterization measurement can be performed during offline testing in, e.g., a design phase of the memory device, where the error count characterization measurement identifies areas of each die with high RBER clusterings and/or a high error count. The predefined usage type assigned to each die can be set to perform programming operations on the upper deck of a die or the bottom deck of a die to avoid performing programming operations on sets of cells addressable by wordlines in areas of each die with high RBER clusterings and/or a high error count.

At operation 320, the processing logic performs the programming operation on a set of cells (e.g., a second set of cells) of the block formed by the wordline residing at the identified deck of the die. In some embodiments, the processing logic can perform the programming operation in a particular order, such as in a source to drain programming sequence or in a drain to source programming sequence. The processing logic can determine whether to perform the programming operation in the source to drain programming sequence or the drain to source programming sequence based on a predefined value assigned to each die. The processing logic can retrieve the predefined value from a data structure, such as a table, e.g., a look-up table and/or a logical-to-physical (L2P) table. The predefined value can be assigned to each die by the memory sub-system controller and/or a firmware component during an offline testing phase of the memory device. The predefined value can be set according to identified high RBER clusterings among the wordlines of each die and/or based on an error count of each die.

In some implementations, the processing logic can receive subsequent requests to perform other programming operations (e.g., a second programming operation) on other sets of cells of other blocks addressable by other wordlines of the same die and/or other die of the memory device. The processing logic can repeat the operations performed at operations 305 to 320 in response to receiving each subsequent request to perform a programming operation.

Figure 4:
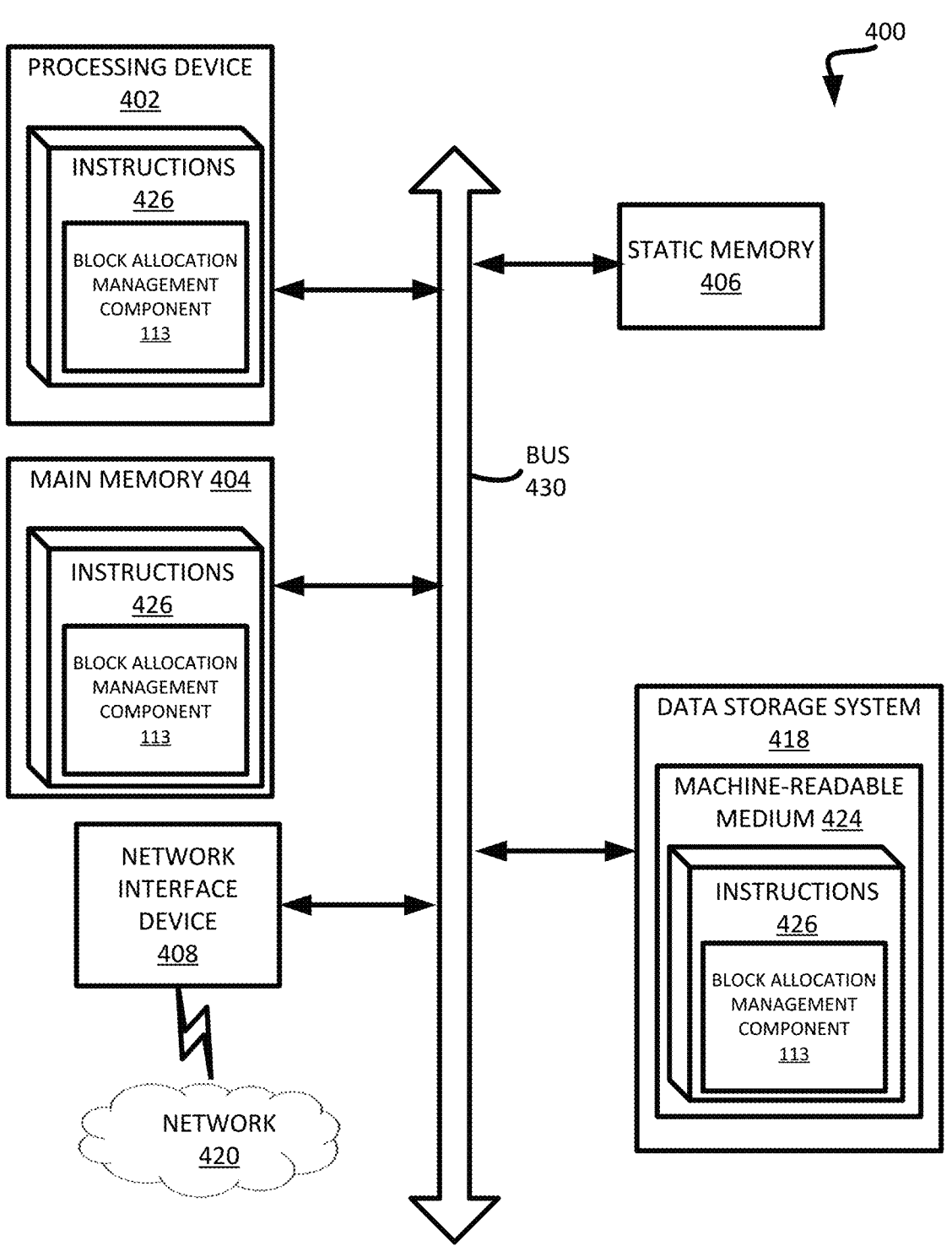
FIG. 4 is a block diagram of an example computer system in which embodiments of the present disclosure can operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block allocation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to the block allocation component 113 of FIG. 1. While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
    receiving a request to perform a programming operation on a first set of cells of a block addressable by a first wordline of a first die of the memory device, wherein the first die comprises a plurality of decks of the memory device;
    determining, based on a higher error count at an area within the first die, a usage type associated with the first die;
    identifying, based on the usage type associated with the first die, a deck of the plurality of decks for performing the programming operation in a manner avoiding the area within the first die with the higher error count; and
    performing the programming operation on a second set of cells of the block addressable by the first wordline residing on the identified deck of the first die.

2. The system of claim 1, wherein the operations further comprise:
retrieving, from a metadata structure, an entry referenced by the usage type associated with the first die, wherein the metadata structure comprises a plurality of entries, each entry associating an identifier of a die of the memory device with a corresponding usage type.

3. The system of claim 2, wherein identifying the deck of the plurality of decks for performing the programming operation comprises:
determining that the usage type corresponds to a block by deck configuration setting, wherein the block by deck configuration setting specifies one of a first deck or a second deck of the plurality of decks for performing the programming operation, and wherein the block addressable by the first wordline of the first die of the memory device spans over the plurality of decks.

4. The system of claim 2, wherein the operations further comprise:
determining that the usage type corresponds to a normal block configuration setting, wherein the block addressable by the first wordline of the first die of the memory device resides on a first deck or a second deck of the plurality of decks.

5. The system of claim 1, wherein the usage type associated with the first die is determined through a characterization measurement on a deck of the plurality of decks.

6. The system of claim 1, wherein the usage type associated with the first die is determined through a characterization measurement on the die.

7. The system of claim 1, wherein the operations further comprise:

receiving a request to perform a second programming operation on a set of cells of a second block addressable by a second wordline of a second die of the memory device; and identifying, based on a second usage type associated with the second die, a deck of the plurality of decks for performing the second programming operation, wherein the second usage type is different from the usage type associated with the first type.

8. A method comprising:

receiving a request to perform a programming operation on a first set of cells of a block addressable by a first wordline of a first die of a memory device, wherein the first die comprises a plurality of decks of the memory device;

determining, based on a higher error count at an area within the first die, a usage type associated with the first die;

identifying, based on the usage type associated with the first die, a deck of the plurality of decks for performing the programming operation in a manner avoiding the area within the first die with the higher error count; and performing the programming operation on a second set of cells of the block addressable by the first wordline residing on the identified deck of the first die.

9. The method of claim 8, further comprising:

retrieving, from a metadata structure, an entry referenced by the usage type associated with the first die, wherein the metadata structure comprises a plurality of entries, each entry associating an identifier of a die of the memory device with a corresponding usage type.

10. The method of claim 9, wherein identifying the deck of the plurality of decks for performing the programming operation comprises:

determining that the usage type corresponds to a block by deck configuration setting, wherein the block by deck configuration setting specifies a first deck or a second deck of the plurality of decks for performing the programming operation, and wherein the block addressable by the first wordline of the first die of the memory device spans over the plurality of decks.

11. The method of claim 9, further comprising:

determining that the usage type corresponds to a normal block configuration setting, wherein the block addressable by the first wordline of the first die of the memory device resides on a first deck or a second deck of the plurality of decks.

12. The method of claim 8, wherein the usage type associated with the first die is determined through a characterization measurement on a deck of the plurality of decks.

13. The method of claim 8, wherein the usage type associated with the first die is determined through a characterization measurement on the die.

14. The method of claim 8, further comprising:

receiving a request to perform a second programming operation on a set of cells of a second block addressable by a second wordline of a second die of the memory device; and identifying, based on a second usage type associated with the second die, a deck of the plurality of decks for performing the second programming operation, wherein the second usage type is different from the usage type associated with the first die.

15. A non-transitory computer-readable storage medium comprising instructions that, when executed by a processing device, cause the processing device to perform operations comprising:

receiving a request to perform a programming operation on a first set of cells of a block addressable by a first wordline of a first die of a memory device, wherein the first die comprises a plurality of decks of the memory device;

determining, based on a higher error count at an area within the first die, a usage type associated with the first die;

identifying, based on the usage type associated with the first die, a deck of the plurality of decks for performing the programming operation in a manner avoiding the area within the first die with the higher error count; and performing the programming operation on a second set of cells of the block addressable by the first wordline residing on the identified deck of the first die.

16. The non-transitory computer-readable storage medium of claim 15, wherein the processing device is to perform operations further comprising:

retrieving, from a metadata structure, an entry referenced by the usage type associated with the first die, wherein the metadata structure comprises a plurality of entries, each entry associating an identifier of a die of the memory device with a corresponding usage type.

17. The non-transitory computer-readable storage medium of claim 16, wherein to identify the deck of the plurality of decks for performing the programming operation, the processing device is to perform operations further comprising:

determining that the usage type corresponds to a block by deck configuration setting, wherein the block by deck configuration setting specifies a first deck or a second deck of the plurality of decks for performing the programming operation, and wherein the block addressable by the first wordline of the first die of the memory device spans over the plurality of decks.

18. The non-transitory computer-readable storage medium of claim 16, wherein the processing device is to perform operations further comprising:

determining that the usage type corresponds to a normal block configuration setting, wherein the block addressable by the first wordline of the first die of the memory device resides on a first deck or a second deck of the plurality of decks.

19. The non-transitory computer-readable storage medium of claim 15, wherein the usage type associated with the first die is determined through a characterization measurement on a deck of the plurality of decks.

20. The non-transitory computer-readable storage medium of claim 15, wherein the processing device is to perform operations further comprising:

receiving a request to perform a second programming operation on a set of cells of a second block addressable by a second wordline of a second die of the memory device; and identifying, based on a second usage type associated with the second die, a deck of the plurality of decks for performing the second programming operation, wherein the second usage type is different from the usage type associated with the first die.

*     *     *     *     *